United States Patent
Kim

(10) Patent No.: US 9,147,718 B2
(45) Date of Patent: Sep. 29, 2015

(54) ORGANIC LIGHT-EMITTING DISPLAY APPARATUS

(71) Applicant: Samsung Display Co., Ltd., Yongin, Gyeonggi-Do (KR)

(72) Inventor: Do-Hoon Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/273,311

(22) Filed: May 8, 2014

(65) Prior Publication Data

US 2015/0108438 A1    Apr. 23, 2015

(30) Foreign Application Priority Data

Oct. 22, 2013 (KR) ........................ 10-2013-0126114

(51) Int. Cl.
*H01L 27/32* (2006.01)

(52) U.S. Cl.
CPC ........ *H01L 27/3258* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 2002/0030769 A1 | 3/2002 | Bae | |
| 2003/0122983 A1 | 7/2003 | Kim et al. | |
| 2005/0045891 A1 | 3/2005 | Yamazaki et al. | |
| 2006/0202615 A1* | 9/2006 | Murakami et al. | 313/506 |
| 2007/0052909 A1* | 3/2007 | Chou et al. | 349/155 |
| 2008/0230767 A1* | 9/2008 | Jung et al. | 257/40 |
| 2010/0109512 A1* | 5/2010 | Shin | 313/504 |
| 2010/0253710 A1* | 10/2010 | Rankov et al. | 345/690 |
| 2011/0109866 A1 | 5/2011 | Ko et al. | |
| 2011/0248313 A1* | 10/2011 | Tsuchiya et al. | 257/100 |
| 2011/0248625 A1 | 10/2011 | Kwon et al. | |
| 2014/0183458 A1 | 7/2014 | Lee et al. | |

FOREIGN PATENT DOCUMENTS

| | | |
|---|---|---|
| JP | 2005-078946 A | 3/2005 |
| KR | 10-2000-0074548 A | 12/2000 |
| KR | 10-2001-0105058 A | 11/2001 |
| KR | 10-2003-0058772 A | 7/2003 |
| KR | 10-2008-0051788 A | 6/2008 |
| KR | 10-2014-0088737 A | 7/2014 |

* cited by examiner

*Primary Examiner* — Khaja Ahmad
(74) *Attorney, Agent, or Firm* — Knobbe, Martens, Olson & Bear, LLP

(57) ABSTRACT

An organic light-emitting display apparatus includes: a lower substrate including a major surface, which comprises a display area and a sealing area surrounding the display area when viewed in a direction perpendicular to the major surface; an insulating structure disposed over the lower substrate in both the display area and the sealing area; a plurality of openings formed through the insulating structure in the sealing area, the openings comprising inner side surfaces; a first conductive layer including a first portion over the insulating structure extending in a horizontal direction, and a second portion extending on at least part of the inner side surfaces of the openings in a vertical direction; an upper substrate placed over the lower substrate; and a sealing member interposed between the lower substrate and the upper substrate in the sealing area thereof and filing the openings, thereby integrating the lower and upper substrates.

20 Claims, 6 Drawing Sheets

ORGANIC LIGHT-EMITTING DISPLAY APPARATUS

RELATED APPLICATION

This application claims the benefit of Korean Patent Application No. 10-2013-0126114, filed on Oct. 22, 2013, in the Korean Intellectual Property Office, the disclosure of which is incorporated herein by reference in its entirety.

BACKGROUND

1. Field

The present disclosure relates to an organic light-emitting display apparatus.

2. Description of the Related Art

An organic light-emitting display apparatus includes a hole injection electrode, an electron injection electrode, and an organic light-emitting device including an organic emission layer formed between the hole injection electrode and the electron injection electrode. The organic light-emitting display apparatus is a self-emission display apparatus where holes injected from the hole injection electrode, and electrons injected from the electron injection electrode are combined in the organic emission layer to form excitons, and light is emitted while the excitons drop from an excited state to a ground state.

The organic light-emitting display apparatus, which is the self-emission display apparatus, does not require separate light sources, and thus may be operated at a low voltage, and formed as a thin and lightweight structure. Also, the organic light-emitting display apparatus has high-quality features such as wide viewing angles, excellent contrast, and quick response, and thus has a wide range of applications from personal portable devices such as MP3 players and cell phones to televisions.

SUMMARY

One or more embodiments of the present invention include an organic light-emitting display apparatus.

Additional aspects will be set forth in part in the description that follows and, in part, will be apparent from the description, or may be learned by practice of the presented embodiments.

According to one or more embodiments of the present invention, there is an organic light-emitting display apparatus including: a lower substrate including a major surface, which comprises a display area for displaying an image thereon and a sealing area surrounding the display area when viewed in a direction perpendicular to the major surface; an insulating structure disposed over the lower substrate in both the display area and the sealing area; a plurality of openings formed through the insulating structure in the sealing area to expose the lower substrate therethrough, the openings comprising inner side surfaces; a first conductive layer including a first portion over the insulating structure extending in a horizontal direction that is generally parallel to the major surface, and a second portion extending on at least part of the inner side surfaces of the openings in a vertical direction that is generally perpendicular to the major surface; an upper substrate placed over the lower substrate; and a sealing member interposed between the lower substrate and the upper substrate in the sealing area thereof and filling the openings, thereby integrating the lower and upper substrates.

The insulating structure may include a plurality of insulating layers.

The plurality of insulating layers may comprise a first insulating layer and a second insulating layer over the first insulating layer. The apparatus may further comprise a second conductive layer interposed between the first and second insulating layers of the insulating structure.

The second insulating layer may include: a first portion formed over the second conductive layer and extending generally in the horizontal direction; and a second portion formed on the side surface of the second conductive layer and extending generally in the vertical direction, thereby providing at least part of the side surface of the openings.

The second insulating layer may further include a third portion extending from second portion generally in the horizontal direction.

The apparatus may further include a third insulating layer disposed on the first conductive layer.

The third insulating layer may include: a first portion extending generally in the horizontal direction on the first portion of the first conductive layer; and a second portion formed on the second portion of the first conductive layer and extending generally in the vertical direction.

The apparatus may further include a partition disposed inside the openings.

The partition may include generally the same layered structure as the insulating structure.

The apparatus may further comprise a first thin film transistor (TFT) including a first activation layer and a first gate electrode disposed in the display area; and a second TFT including a second activation layer and a second gate electrode disposed in the display area. The first and second gate electrodes may be disposed at different levels.

The first conductive layer may be arranged at the same level as the second gate electrode, and the second conductive layer may be arranged at the same level as the first gate electrode.

The apparatus may further comprise a first gate insulating layer interposed between the first activation layer and the first gate electrode, and a second gate insulating layer disposed on the first gate electrode. The second activation layer may be disposed at the same level as the first activation layer, and the second gate electrode may be disposed on the second gate insulating layer over the second activation layer.

The first insulating layer in the sealing area may include a portion that extends from the first gate insulating layer in the display area, and the second insulating layer may include a portion that extends from the second gate insulating layer in the display area.

The apparatus may further comprise a driving thin film transistor comprising a driving activation layer and a driving gate electrode; a capacitor including the driving gate electrode functioning as a lower electrode, and an upper electrode; a first gate insulating layer interposed between the driving activation layer and the driving gate electrode; and a second gate insulating layer interposed between the driving gate electrode and the upper electrode.

The first conductive layer may be disposed at the same level as the upper electrode, and the second conductive layer may be disposed at the same level as the driving gate electrode.

The first insulating layer in the sealing area may include a portion that extends from the first gate insulating layer in the display area, and the second insulating layer in the sealing area may include a portion that extends from the second gate insulating layer in the display area.

The first conductive layer may be disposed only at an edge of the sealing area.

The insulating layer, the first conductive layer, and the second conductive layer may be disposed at an edge of the sealing area, and the insulating layer and the second conductive layer may be disposed at a center of the sealing area.

The apparatus may further include at least one organic light-emitting device disposed in the display area. The at least one organic light-emitting device may include: a pixel electrode; an opposite electrode placed over the pixel electrode; and an intermediate layer arranged between the pixel electrode and the opposite electrode, and including an organic emission layer.

The sealing member may include frit, and may directly contact exposed portions of the lower substrate through the openings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
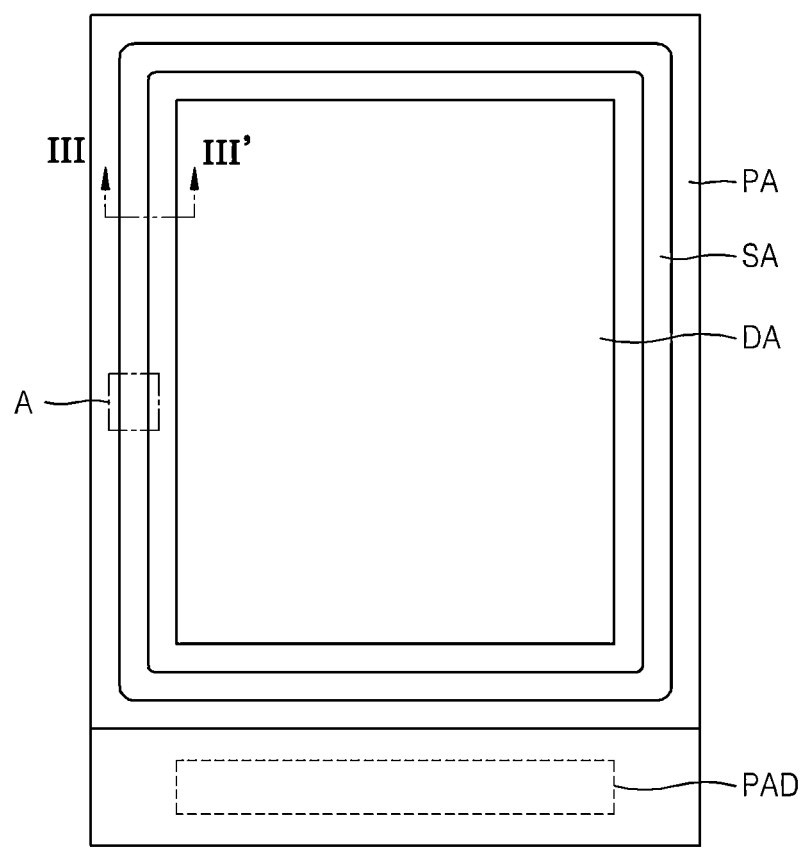
FIG. 1 is a schematic plan view of an organic light-emitting display apparatus, according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments of the invention will be described with reference to the attached drawings. Like reference numerals in the drawings denote like elements, and thus their description will not be repeated.

It will be understood that although the terms "first" and "second" are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers.

In the drawings, the sizes and the thicknesses of layers and regions are exaggerated for convenience of explanation, and thus the sizes and the thicknesses are not limited thereto.

Figure 2:
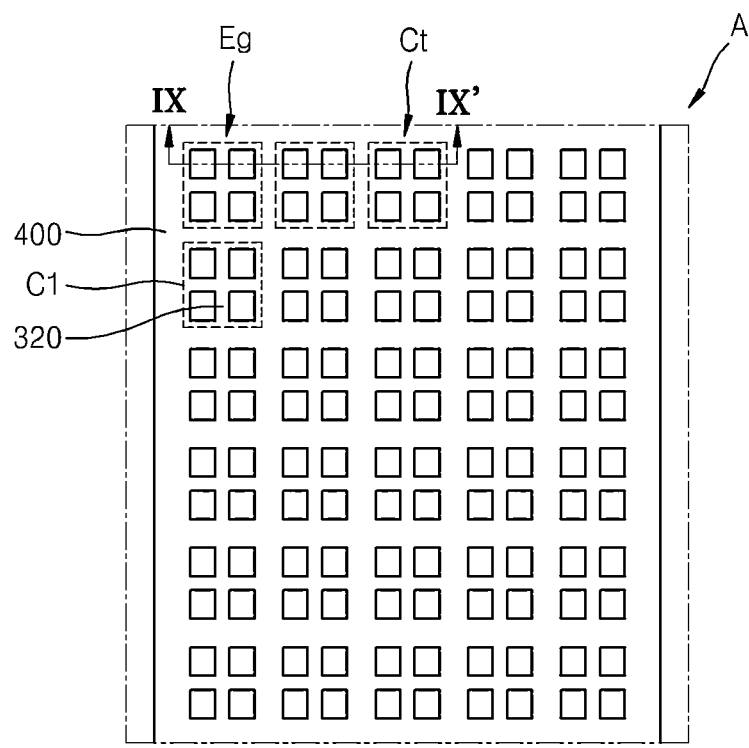
FIG. 2 is a plan view illustrating an enlarged section A of the organic-light-emitting display apparatus, according to an embodiment of the present invention.
Figure 3:
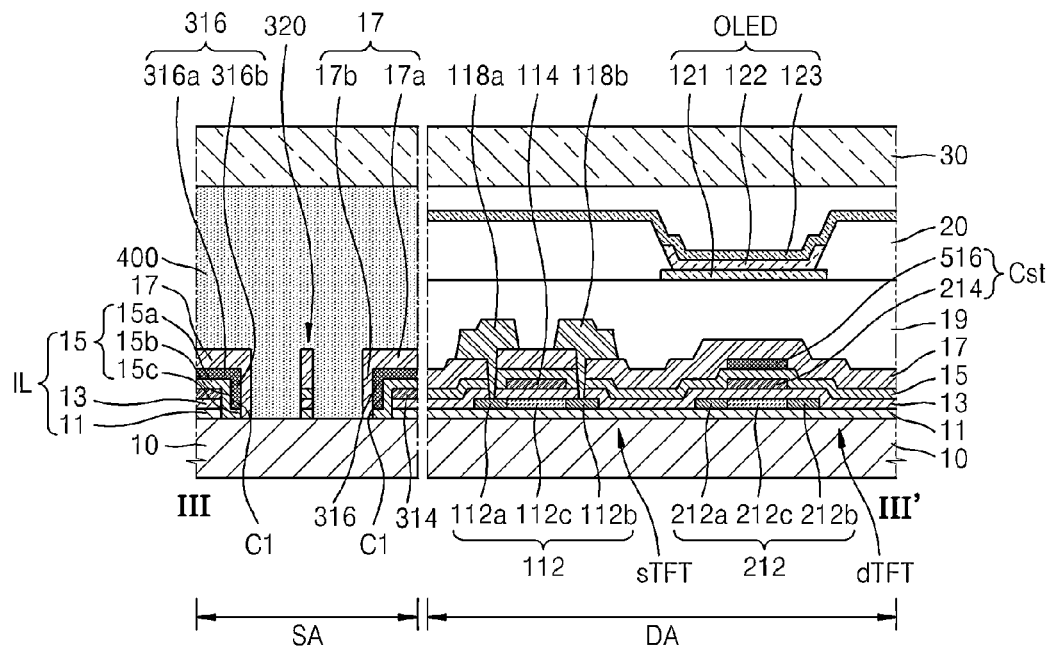
FIG. 3 is a cross-sectional view, taken along a line III-III' of FIG. 1, according to an embodiment of the present invention.

FIG. 1 is a schematic plan view of an organic light-emitting display apparatus, according to an embodiment of the present invention, FIG. 2 is a plan view illustrating an enlarged section A of FIG. 1, and FIG. 3 is a cross-sectional view, taken along the line III-III' of FIG. 1.

Referring to FIGS. 1 through 3, the organic light-emitting display apparatus includes: a lower substrate 10 including a display area DA including a plurality of pixels and configured to display an image thereon, and a non-display area PA surrounding the display area DA; an upper substrate 30 placed over the lower substrate 10; and a sealing member 400 arranged in the non-display area PA and attaching the lower and upper substrates 10 and 30. An area on which the sealing member 400 is arranged is a sealing area SA.

A pad unit PAD may be arranged at an edge of the lower substrate 10 that is not covered with the upper substrate 30.

Although not illustrated in the drawings, the non-display area PA may further include a driving circuit unit for driving the pixels included in the display area DA, and wiring, which may be extended to the pad unit PAD. A flexible printed circuit board (FPCB) may be attached to the pad unit PAD.

The lower substrate 10 may include various materials such as glass, metals, or plastic. The pixels are arranged on the lower substrate 10 in the display area PA, and respective pixels may include thin film transistors (TFTs) (for example, dTFT and sTFT), a capacitor Cst, and an organic light-emitting device (OLED).

In FIG. 3, only a driving thin film transistor (dTFT) and a switching thin film transistor (sTFT) are illustrated. However, each pixel may further include other TFTs performing various functions. Although not illustrated in the drawings, the dTFT may be electrically connected to a pixel electrode 121 included in the OLED via other TFTs.

Referring to FIG. 3, a buffer layer 11 is arranged on the lower substrate 10, and on the buffer layer 11, a driving activation layer 212 of the dTFT, and a switching activation layer 112 of the sTFT are arranged. The buffer layer 11 may be formed of silicon oxide or silicon nitride in order to ensure a surface of the lower substrate 10 is flat, and/or to prevent impurities from penetrating into the activation layers 112 and 212. The activation layers 112 and 212 may include various materials. For example, the activation layers 112 and 212 may contain inorganic semiconductor materials such as amorphous silicon or crystalline silicon, and may include source areas 112a and 212a, drain areas 112b and 212b doped with ion impurities, and channel areas 112c and 212c connecting the source areas 112a and 212a and the drain areas 112b and 212b. As another example, the activation layers 112 and 212 may include an oxide semiconductor or organic semiconductor materials.

A first gate insulating layer 13 formed of silicon oxide and/or silicon nitride is arranged on the buffer layer 11 so as to cover the activation layers 112 and 212. A switching gate electrode 114 is arranged on the first gate insulating layer 13 over the switching activation layer 112, and a driving gate electrode 214 may be arranged over the driving activation layer 212.

The dTFT and the capacitor Cst of the organic light-emitting display apparatus may overlap with each other, and the driving gate electrode 214 may function as a lower electrode of the capacitor Cst.

The switching gate electrode 114 and the driving gate electrode 214 may be formed as a single layer or multiple layers including at least one metal selected from the group consisting of aluminum (Al), platinum (Pt), palladium (Pd), silver (Ag), magnesium (Mg), gold (Au), nickel (Ni), neodymium (Nd), iridium (Ir), calcium (Ca), molybdenum (Mo), titanium (Ti), tungsten (W), and copper (Cu).

On the first gate insulating layer 13, a second gate insulating layer 15 may be arranged to cover the gate electrodes 114 and 214, and on the second gate insulating layer 15, an upper electrode 516 placed over the driving gate electrode 214 functioning as the lower electrode of the capacitor Cst may be arranged.

The upper electrode 516 may be formed as a single layer or multiple layers including at least one selected from the group consisting of Al, Pt, Pd, Ag, Mg, Au, Ni, Nd, Ir, Cr, Li, Ca, Mo, Ti, W, and Cu.

In the organic light-emitting display apparatus described in the present embodiment, since the dTFT and the capacitor Cst are arranged to overlap with each other, an area for the capacitor Cst can be secured such that the capacitor Cst may have enough capacitance in high resolution.

An interlayer insulating layer 17 that is formed as a single layer or multiple layers including materials such as silicon oxide or silicon nitride may be arranged on the second gate insulating layer 15 in order to cover the upper electrode 516. On the interlayer insulating layer 17, a switching source electrode 118a and a switching drain electrode 118b of the sTFT may be arranged. The switching source electrode 118a and a switching drain electrode 118b may be electrically connected to the source and drain areas 112a and 112b of the switching activation layer 112, respectively.

The switching source electrode 118a and the switching drain electrode 118b may be formed as a single layer or multiple layers including at least one selected from the group consisting of Al, Pt, Pd, Ag, Mg, Au, Ni, Nd, Ir, Cr, Li, Ca, Mo, Ti, W, and Cu.

On the interlayer insulating layer 17, a planarization layer 19 formed as a single layer or multiple layers including acryl-based organic materials or benzocyclobutene (BCB) may be arranged in order to cover the switching source electrode 118a and the switching drain electrode 118b.

On the planarization layer 19, the OLED including the pixel electrode 121, an opposite electrode 123 placed over the pixel electrode 121, and an intermediate layer 122 arranged therebetween and including an organic emission layer may be arranged.

The pixel electrode 121 is formed of a translucent or transparent electrode or a reflective electrode. When the pixel electrode 121 is formed of the translucent or transparent electrode, the pixel electrode 121 may be formed of at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). When the pixel electrode 121 is formed of the reflective electrode, the pixel electrode 121 may include a reflective layer including at least one selected from the group consisting of Al, Pt, Pd, Ag, Mg, Au, Ni, Nd, Ir, Cr, Li, Ca, Mo, Ti, W, Cu, and compounds thereof, and layers formed of ITO, IZO, ZnO, $In_2O_3$, IGO, and AZO. However, the present embodiment is not limited thereto, and the pixel electrode 121 may be formed of various materials.

A pixel defining layer 20 may be arranged on the planarization layer 19. The pixel defining layer 20 includes an opening exposing a center of the pixel electrode 121, and defines the pixels. Also, the pixel defining layer 20 increases the distance between an end of the pixel electrode 121 and the opposite electrode 123 disposed on the pixel electrode 121, thereby preventing the generation of an arc, and etc. at the end of the pixel electrode 121. The pixel defining layer 20 may be formed of organic materials such as polyimide.

The intermediate layer 122 may be arranged on the pixel electrode 121. As discussed above, the intermediate layer 122 may include the organic emission layer, and may further include at least one of a hole injection layer, a hole transport layer, an electron transport layer, and an electron injection layer. However, one or more embodiments discussed herein are not limited to such examples, and the intermediate layer 122 may include the organic emission layer and various other functional layers.

When the OLED is a full-color OLED, the organic emission layer may be patterned as red, green, and blue emission layers according to red, green, and blue sub-pixels.

The organic emission layer may have a multi-layer structure in which the red, green, and blue emission layers are stacked in order to emit white light, or have a single-layer structure including red, green, and blue emission materials. The OLED including the organic emission layer may emit full-color light by additionally including red, green, and blue color filters.

The opposite electrode 123 is arranged on the intermediate layer 122. The opposite electrode 123 may be formed of the translucent or transparent electrode or the reflective electrode. When the opposite electrode 123 is formed of the translucent or transparent electrode, the opposite electrode 123 may include at least one selected from the group consisting of Ag, Al, Mg, Li, Ca, Cu, lithium fluoride/calcium (LiF/Ca), LiF/Al, MgAg, and CaAg, and may be formed as a thin film having a thickness of several nanometers to tens of nanometers in order for the light to penetrate the opposite electrode 123. When the opposite electrode 123 is formed of the reflective electrode, the opposite electrode 123 may include the reflective layer including at least one material selected from the group consisting of Ag, Al, Mg, Li, Ca, Cu, LiF/Ca, LiF/Al, MgAg, and CaAg.

The upper substrate 30 placed over the lower substrate 10 may be formed of various materials such as glass, metals, or plastic. The lower and upper substrates 10 and 30 may be attached by the sealing member 400. The sealing member 400 may include frit or epoxy, but is not limited thereto.

Referring to FIGS. 2 and 3, on the lower substrate 10 corresponding to the sealing area SA in which the sealing member 400 is arranged, the insulating layer IL including the openings C1, and the first conductive layer 316 including a first area 316a (e.g., the portion that is parallel to the plane of the lower substrate 10 in FIG. 3) arranged on top surface of the insulating layer IL, and a second area 316*b* (e.g., the portion that is perpendicular to the plane of the lower substrate 10 in FIG. 3) extended along a side portion of the insulating layer IL in an inward direction of the openings C1 may be arranged.

The insulating layer IL may include the first insulating layers 11 and 13 and the second insulating layer 15, and between the first insulating layers 11 and 13 and the second insulating layer 15, the second conductive layer 314 may be arranged. In addition, the first insulating layers 11 and 13 and the second conductive layer 314 may include the same etched surface. That is, the first insulating layers 11 and 13, and the second conductive layer 314 may be etched using the same mask in a manufacturing procedure.

In the present embodiment, the first and second conductive layers 316 and 314 may be arranged on the same layer (or at the same level) as the upper electrode 516 of the capacitor Cst, and the driving gate electrode 214, and may include the same material, respectively.

The first insulating layers 11 and 13 may be portions that extend from the buffer layer 11 and the first gate insulating layer 13 in the display area DA, and the second insulating layer 15 may be a portion that extends from the second gate insulating layer 15 in the display area DA.

The second insulating layer 15 may include a first area 15*a* (e.g., the portion that extends horizontally in FIG. 3) arranged on a top surface of the second conductive layer 314, a second area 15*b* (e.g., the portion that extends vertically in FIG. 3) arranged to cover the end of the second conductive layer 314 by changing a direction from the first area 15*a*, and a third area 15*c* (e.g., the portion that extends horizontally alongside the lower substrate 10 in FIG. 3) arranged between an end of the second area 316*b* of the first conductive layer 316 and the lower substrate 10 by changing a direction from the second area 15*b*.

That is, the second insulating layer 15 is arranged between the first and second conductive layers 316 and 314, and thus the first conductive layer 316 may be insulated from the second insulated layer 314. Also, the third area 15*c* of the second insulating layer 15 may be arranged between the first conductive layer 316 and the lower substrate 10 in order to prevent problems that occur when adhesion becomes weak due to a direct connection of the first conductive layer 316 (which includes metals, and etc.) to the lower substrate 10.

A third insulating layer 17 may be a portion that extends from the interlayer insulating layer 17 in the display area DA, and may include a first area 17*a* (e.g., the portion that extends horizontally in FIG. 3) arranged on the top surface of the first conductive layer 316, and a second area 17*b* (e.g., the portion that extends vertically in FIG. 3) extended along the side portion of the first conductive layer 316 in the inward direction of the openings C1 by changing a direction from the first area 17*a*.

The third insulating layer 17 may be arranged to cover the first conductive layer 316, such that the first conductive layer 316 does not directly contact the sealing member 400.

The lower and upper substrates 10 and 30 are attached by the sealing member 400, and the sealing member 400 may be formed by spreading a material for forming the sealing member 400 (e.g., frit) and irradiating a laser beam such as a heat source to the material to harden the material.

In this regard, the sealing member 400 may be firmly and evenly hardened throughout the sealing area SA such that the lower and upper substrates 10 and 30 are not easily separated.

Since the insulating layer IL included in the sealing area SA of the organic light-emitting display apparatus includes the openings C1, an area of the sealing member 400 that contacts the third insulating layer 17 and the lower substrate 10 may be increased, thereby improving the adhesion. The sealing member 400 (which includes frit, and etc.) directly contacts the lower substrate 10 (which is, for example, formed of glass or the like), thus further improving the adhesion.

According to the present embodiment, the first and second conductive layers 316 and 314 arranged on the sealing area SA included in the organic light-emitting display apparatus absorb the laser beam for hardening the sealing member 400, and transfer heat generated by the laser beam to other areas so that the sealing member 400 may be evenly hardened throughout the sealing area SA.

Since the first conductive layer 316 is arranged to cover not only the top surface of the insulating layer IL but also the side portion thereof, absorption and conduction of the laser beam are increased and the sealing member 400 is efficiently hardened. Therefore, the adhesion of the lower and upper substrates 10 and 30 may be increased.

A partition 320 that is formed in the same layer and of the same material as the first insulating layers 11 and 13, the second insulating layer 15, and the third insulating layer 17 may be arranged inside the openings included in the insulating layer IL.

By increasing the area where the sealing member 400 contacts the first insulating layers 11 and 13, the second insulating layer 15, and the third insulating layer 17 through the partition 320, the adhesion may be increased.

Referring to FIG. 2, the partition 320 may be arranged in the openings C1 in a cross shape. However, the present embodiment is not limited thereto. The partition 320 may not be arranged, or may be arranged in different shapes.

Figure 4:
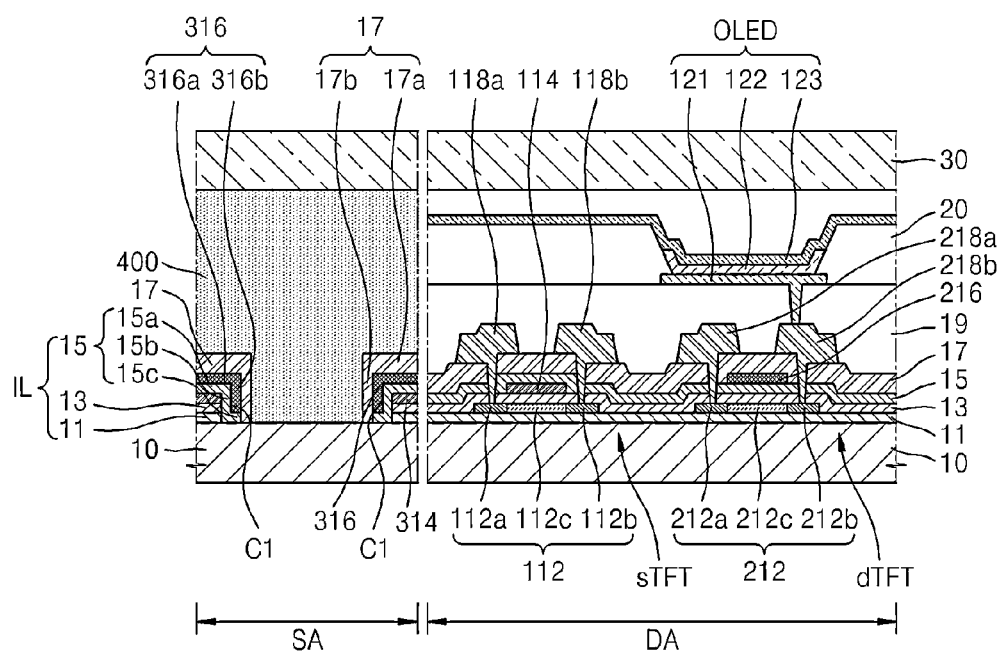
FIG. 4 is a schematic cross-sectional view of an organic-light-emitting display apparatus, according to another embodiment of the present invention.

FIG. 4 is a schematic cross-sectional view of an organic light-emitting display apparatus according to another embodiment of the present invention.

Referring to FIG. 4, the organic light-emitting display apparatus includes the lower substrate 10 including the sealing area SA included in the display area DA and the non-display area PA of FIG. 1, and the upper substrate 30 placed over the lower substrate 10. In the sealing area SA, the sealing member 400 attaching the lower and upper substrate 10 and 30 is arranged.

The display area DA may include the sTFT, dTFT, and the OLED that is electrically connected to the dTFT.

Although not illustrated in the drawing, the display area DA may further include other TFTs performing different functions other than the sTFT, and dTFT.

The buffer layer 11 is arranged on the lower substrate 10, and on the buffer layer 11, the driving activation layer 212 of the dTFT, and the switching activation layer 112 of the sTFT are arranged. The activation layers 112 and 212 may contain various materials. For example, the activation layers 112 and 212 may contain the inorganic semiconductor materials such as amorphous silicon or crystalline silicon, and may include the source areas 112*a* and 212*a*, the drain areas 112*b* and 212*b* doped with the ion impurities, and the channel areas 112*c* and 212*c* connecting the source areas 112*a* and 212*a*, and the drain areas 112*b* and 212*b*. As another example, the activation layers 112 and 212 may include the oxide semiconductors, or the organic semiconductor materials.

On the buffer layer 11, the first gate insulating layer 13 formed of silicon oxide and/or silicon nitride may be arranged, and the switching gate electrode 114 may be arranged on the first gate insulating layer 13 over the switching activation layer 112.

On the first gate insulating layer 13, the second gate insulating layer 15 may be arranged to cover the switching gate electrode 114, and on the second gate insulating layer 15, a driving gate electrode 216 may be arranged.

The switching and driving gate electrodes 114 and 216 may be formed as a single layer or multiple layers including at least one selected from the group consisting of Al, Pt, Pd, Ag, Mg, Au, Ni, Nd, Ir, Cr, Li, Ca, Mo, Ti, W, and Cu.

In the organic light-emitting display apparatus, the gate electrodes of different TFTs are arranged on different layers (or at different levels) such that a distance between gate wiring, which is arranged on different layers, may be shortened, and thus the high resolution may be accomplished.

On the second gate insulating layer 15, the intermediate insulating layer 17 formed as a single layer or multiple layers including silicon oxide or silicon nitride may be arranged, and on the intermediate insulating layer 17, the switching source electrode 118a, the switching drain electrode 118b, and the driving source electrode 218a and the driving drain electrode 218b may be arranged.

Also, on the intermediate insulating layer 17, the planarization layer 19 may be arranged in order to cover the source electrodes 118a and 218a, and the drain electrodes 118b and 218b.

On the planarization layer 19, the OLED including the pixel electrode 121 that is electrically connected to the driving drain electrode 218b, and the opposite electrode 123 placed over the pixel electrode 121, and the intermediate layer 122 interposed between the pixel and opposite electrodes 121 and 123 and including the organic emission layer may be arranged.

The pixel defining layer 20 may be arranged on the planarization layer 19. The pixel defining layer 20 includes the openings exposing the center of the pixel electrode 121, and defines the pixels. The pixel defining layer 20 may be formed of the organic materials such as polyimide.

The upper substrate 30 placed over the lower substrate 10 may be formed of various materials such as glass, metals, or plastic. The lower and upper substrates 10 and 30 may be attached using the sealing member 400. The sealing member 400 may include frit, epoxy, or the like, but the present embodiment is not limited thereto and the sealing member 400 may include one or more other materials.

On the lower substrate 10 in the sealing area SA, the insulating layer IL including the openings C1, and the first conductive layer 316 including the first area 316a (e.g., the portion that extends horizontally in FIG. 4) arranged on the top surface of the insulating layer IL, the second area 316b (e.g., the portion that extends vertically in FIG. 4) extended along the side portion of the insulating layer IL in the inward direction of the openings C1 of may be arranged.

The insulating layer IL may include the first insulating layers 11 and 13, the second insulating layer 15, and the second conductive layer 314 may be arranged therebetween (e.g., between the first insulating layer 13 and the second insulating layer 15, as shown in FIG. 4).

In the present embodiment, the first and second conductive layers 316 and 314 may be arranged in the same layers (or at the same level) as the driving gate electrode 216 of the dTFT, and the switching gate electrode 114, and may include the same materials (or include the substantially similar layered structure), respectively.

The first insulating layers 11 and 13 in the sealing area SA may be portions that extends from the buffer layer 11 and the first gate insulating layer 13 in the display area DA, and the second insulating layer 15 in the sealing area SA may be a portion that extends from the second gate insulating layer 15 in the display area DA.

The second insulating layer 15 may include: the first area 15a (e.g., the portion that extends horizontally in FIG. 4) arranged on the top surface of the second conductive layer 314; the second area 15b (e.g., the portion that extends vertically in FIG. 4) arranged to cover the end of the second conductive layer 314 by changing the direction from the first area 15a; and the third area 15c (e.g., the portion that extends horizontally alongside the lower substrate 10 in FIG. 4) arranged between the lower substrate 10 and the end of the second area 316b of the first conductive layer 316 by changing the direction from the second area 15b.

That is, the second insulating layer 15 is arranged between the first and second conductive layers 316 and 314, and thus the first conductive layer 316 may be insulated from the second conductive layer 314. Also, the third area 15c of the second insulating layer 15 may be arranged between the first conductive layer 316 and the lower substrate 10 in order to prevent the problems with regard to the lower adhesion that is caused by a direct contact between the first conductive layer 316 (which includes metals) and the lower substrate 10.

The third insulating layer 17 may be arranged on the first conductive layer 316, and may include the first area 17a (e.g., the portion that extends horizontally in FIG. 4) arranged on the top surface of the first conductive layer 316, and the second area 17b (e.g., the portion that extends vertically in FIG. 4) extended along the side portion of the first conductive layer 316 in the inward direction of the openings C1 by changing the direction from the first area 17a.

The third insulating layer 17 in the sealing area SA may be a portion that extends from the intermediate layer 17 of the display area DA, and may be arranged to cover the first conductive layer 316 such that the sealing member 400 and the first conductive layer 316 do not contact each other.

In FIG. 4, the sTFT, and dTFT are illustrated for convenience of explanation, but the present embodiment is not limited thereto. In other words, the sTFT and dTFT may be randomly selected first and second TFTs performing different functions, and the switching activation layer, the switching gate electrode, the switching source electrode, and the switching drain electrode may respectively indicate the first activation layer, the first gate electrode, the first source electrode, and the first drain electrode of the first TFT. Also, the driving activation layer, the driving gate electrode, the driving source electrode, and the driving drain electrode may respectively indicate the second activation layer, the second gate electrode, the second source electrode, and the second drain electrode.

Figure 5:
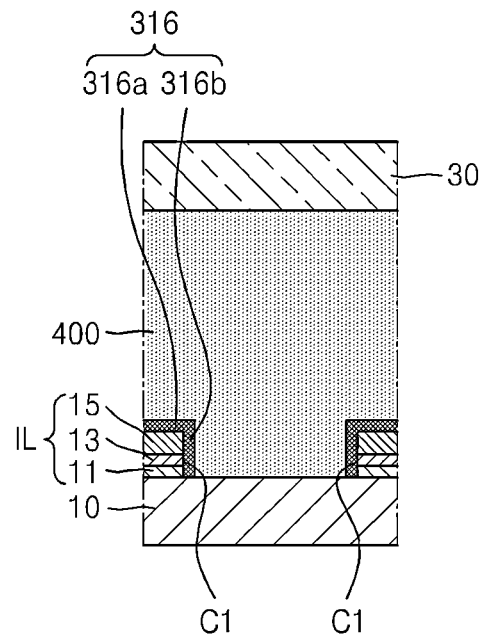
FIG. 5 is a cross-sectional view of a sealing area included in the organic-light-emitting display apparatus, according to another embodiment of the present invention.

FIG. 5 is a cross-sectional view illustrating the sealing area SA included in an organic light-emitting display apparatus, according to another embodiment of the present invention.

Referring to FIG. 5, on the lower substrate 10 in the sealing area SA included in the organic light-emitting display apparatus, the insulating layer IL including the openings C1, and the first conductive layer 316 including the first area 316a (e.g., the portion that extends horizontally in FIG. 5) arranged on the top surface of the insulating layer IL, and the second area 316b (e.g., the portion that extends vertically in FIG. 5) extended along the side portion of the insulating layer IL in the inward direction of the openings C1 are arranged.

The insulating layer IL may include the plurality of insulating layers 11, 13 and 15, and the partition 320 of FIG. 3 may not be arranged inside the openings C1 included in the insulating layer IL.

Other configurations are the same as the organic light-emitting display apparatus of FIG. 3, and thus no description will be provided.

Figure 6:
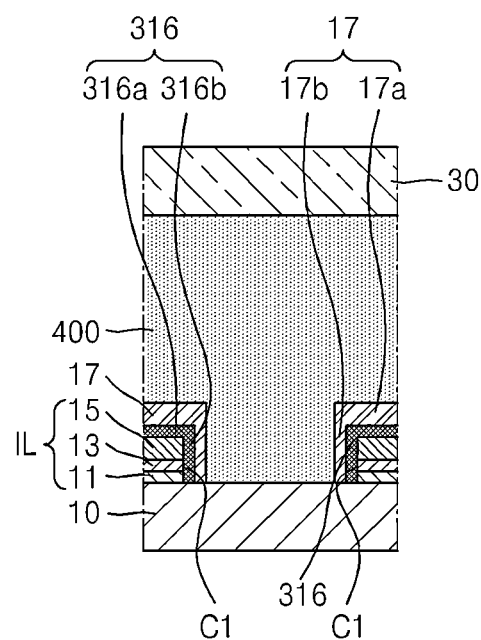
FIG. 6 is a cross-sectional view of a sealing area included in the organic light-emitting display apparatus, according to another embodiment of the present invention.

FIG. 6 is a cross-sectional view illustrating a sealing area SA included in the organic light-emitting display apparatus according to another embodiment of the present invention.

Referring to FIG. 6, on the lower substrate 10 in the sealing area SA included in the organic light-emitting display apparatus, the insulating layer IL including the openings C1, and the first conductive layer 316 including the first area 316a (e.g., the portion that extends horizontally in FIG. 6) arranged on the top surface of the insulating layer IL, and the second area 316b (e.g., the portion that extends vertically in FIG. 6) extended along the side portion of the insulating layer IL in the inward direction of the openings C1 are arranged.

The insulating layer IL may include the plurality of insulating layers 11, 13 and 15, and the partition 320 of FIG. 3 may not be arranged inside the openings C1 included in the insulating layer IL.

The third insulating layer 17 may be arranged on the first conductive layer 316, and may include the first area 17a (e.g., the portion that extends horizontally in FIG. 6) arranged on the top surface of the first conductive layer 316, and the second area 17b (e.g., the portion that extends vertically in FIG. 6) extended along the side portion of the first conductive layer 316 in the inward direction of the openings C1 by changing the direction from the first area 17a.

Other configurations are the same as the organic light-emitting display apparatus of FIG. 3, and thus no description will be provided.

Figure 7:
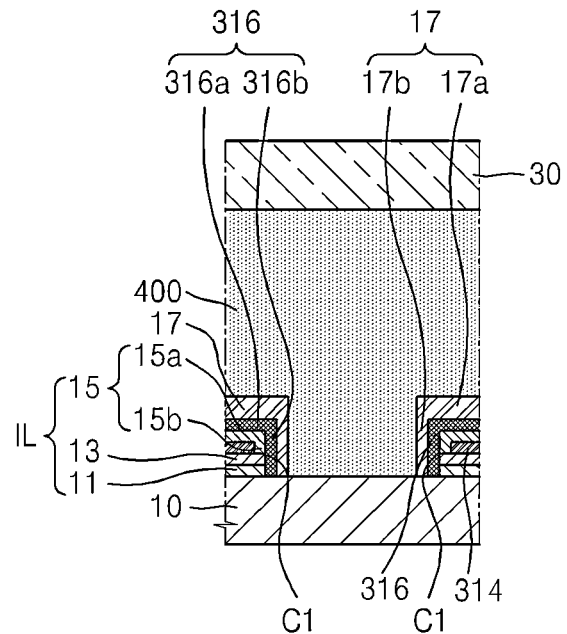
FIG. 7 is a cross-sectional view of a sealing area included in the organic light-emitting display apparatus, according to another embodiment of the present invention.

FIG. 7 is a cross-sectional view of a sealing area SA included in the organic light-emitting display apparatus according to another embodiment of the present invention.

Referring to FIG. 7, on the lower substrate 10 in the sealing area SA included in the organic light-emitting display apparatus, the insulating layer IL including the openings C1, and the first conductive layer 316 including the first area 316a (e.g., the portion that extends horizontally in FIG. 7) arranged on the top surface of the insulating layer IL, and the second area 316b (e.g., the portion that extends vertically in FIG. 7) extended along the side portion of the insulating layer IL in the inward direction of the openings C1 are arranged.

The insulating layer IL may include the first insulating layers 11 and 13 and the second insulating layer 15, and the second conductive layer 314 may be arranged therebetween.

The third insulating layer 17 may be arranged on the first conductive layer 316, and may include the first area 17a (e.g., the portion that extends horizontally in FIG. 7) arranged on the top surface of the first conductive layer 316, and the second area 17b (e.g., the portion that extends vertically in FIG. 7) extended along the side portion of the first conductive layer 316 in the inward direction of the openings C1 by changing the direction from the first area 17a.

The second insulating layer 15 may include the first area 15a (e.g., the portion that extends horizontally in FIG. 7) arranged on the top surface of the second conductive layer 314, and the second area 15b (e.g., the portion that extends vertically in FIG. 7) covering the end of the second conductive layer 314, and the first and second conductive layers 316 and 314 may be insulated by the second insulating layer 15.

The second conductive layer 314 according to the present embodiment may be arranged in an area that is inward from the ends of the first insulating layers 11, 13 at a predetermined distance, and the first insulating layers 11 and 13 and the second insulating layer 15 may include the same etched surface.

That is, the top surface and the end of the second conductive layer 314 may be completely covered with the second insulating layer 15. Therefore, the second conductive layer 314 may be separated from the first conductive layer 316 that is arranged on the second insulating layer 15, by the second insulating layer 15.

Other configurations are the same as the organic light-emitting display apparatus of FIG. 3, and thus no description will be provided.

Figure 8:
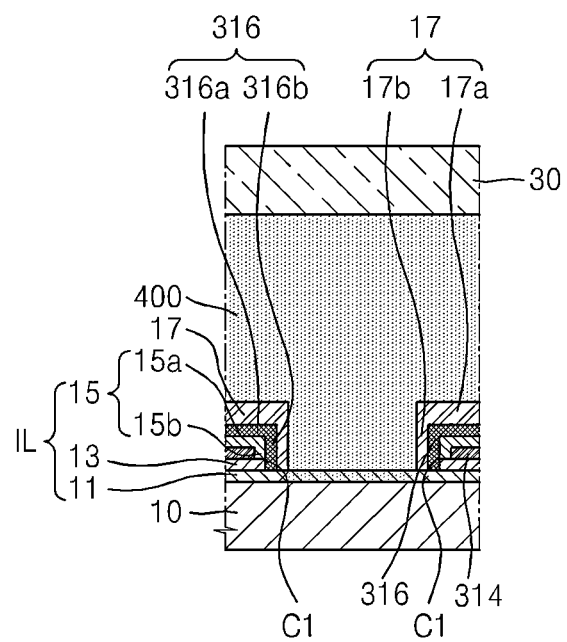
FIG. 8 is a cross-sectional view of a sealing area included in the organic light-emitting display apparatus, according to another embodiment of the present invention.

FIG. 8 is a cross-sectional view of a sealing area SA included in the organic light-emitting display apparatus according to another embodiment of the present invention.

Referring to FIG. 8, on the lower substrate 10 in the sealing area SA included in the organic light-emitting display apparatus, the insulating layer IL including the openings C1, and the first conductive layer 316 including the first area 316a (e.g., the portion that extends horizontally in FIG. 8) arranged on the top surface of the insulating layer IL, and the second area 316b (e.g., the portion that extends vertically in FIG. 8) extended along the side portion of the insulating layer IL in the inward direction of the openings C1 are arranged.

The insulating layer IL may include the first insulating layer 13 and second insulating layer 15, and the second conductive layer 314 may be arranged therebetween.

The third insulating layer 17 may be arranged on the first conductive layer 316, and may include the first area 17a (e.g., the portion that extends horizontally in FIG. 8) arranged on the top surface of the first conductive layer 316, and the second area 17b (e.g., the portion that extends vertically in FIG. 8) extended along the side portion of the first conductive layer 316 in the inward direction of the openings C1 by changing the direction from the first area 17a.

The second insulating layer 15 may include the first area 15a (e.g., the portion that extends horizontally in FIG. 8) arranged on the top surface of the second conductive layer 314, and the second area 15b (e.g., the portion that extends vertically in FIG. 8) covering the end of the second conductive layer 314, and the first and second conductive layers 316 and 314 may be insulated by the second insulating layer 15.

The second conductive layer 314 according to the present embodiment may be arranged in an area that is inward from the ends of the first insulating layer 11 at a predetermined distance, and the first insulating layer 13 and the second insulating layer 15 may have the same etched surface.

That is, the top surface and the end of the second conductive layer 314 may be completely covered with the second insulating layer 15. Therefore, the second conductive layer 314 may be separated from the first conductive layer 316 that is arranged on the second insulating layer 15, by the second insulating layer 15.

In the present embodiment, the first insulating layer 13 is formed as a single layer, and the buffer layer 11 may be arranged at the bottom of the first insulating layer 13. The buffer layer 11 may not include the openings C1, and may be arranged throughout the lower substrate 10. Accordingly, the sealing member 400 and the lower substrate 10 may not directly contact each other.

Other configurations are the same as the organic light-emitting display apparatus of FIG. 3, and thus no description will be provided.

Figure 9:
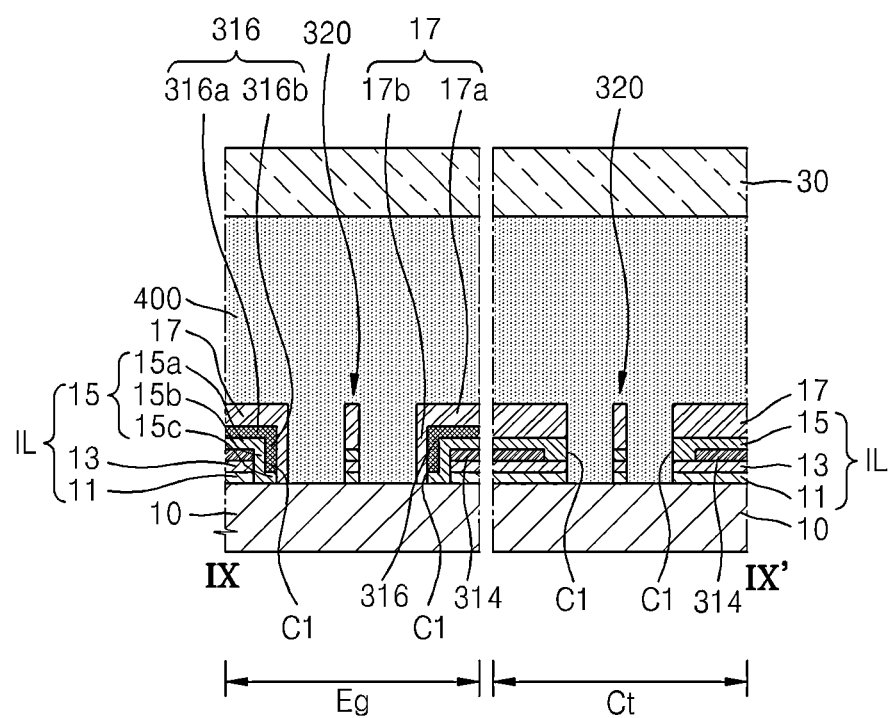
FIG. 9 is a cross-sectional view, taken along a line IX-IX' of FIG. 2, according to an embodiment of the present invention.

FIG. 9 is a cross-sectional view, taken along a line IX-IX' of FIG. 2, according to an embodiment of the present invention.

Referring to FIGS. 2 and 9, in the sealing area SA included in the organic light-emitting display apparatus, the sealing member 400 attaching the lower and upper substrates 10 and 30 is arranged, and on the lower substrate 10 in the sealing area SA, the insulating layer IL including the openings C1 is arranged.

The sealing member 400 may be formed after spreading a material for forming the sealing member 400 such as frit, and irradiating the laser beam as a heat source to the material for hardening. In general, intensity of the laser beam is high at the center, but decreases as the laser beam moves farther away from the center, which is referred to the Gaussian distribution.

Accordingly, when irradiating the sealing member 400 with the laser beam, the intensity of the laser beam at the center Ct of the sealing member 400 (or sealing area SA) is high, but that of the laser beam at the edge Eg of the sealing member 400 (or sealing area SA) may be low.

Due to this difference, the sealing member 400 may not be evenly hardened throughout the entire area.

In the organic light-emitting display apparatus according to the present embodiment, the first conductive layer 316 is arranged on an edge Eg of the sealing member 400 as described above so that the absorption and conduction of the light irradiated to the edge Eg may be improved.

Referring to FIG. 9, on the lower substrate 10 at the edge Eg of the sealing area SA, the insulating layer IL including the openings C1, and the first conductive layer 316 including the first area 316a (e.g., the portion that extends horizontally in FIG. 9) arranged on the top surface of the insulating layer IL, and the second area 316b (e.g., the portion that extends vertically in FIG. 9) extended along the side portion of the insulating layer IL in the inward direction of the openings C1 are arranged.

The insulating layer IL may include the first insulating layers 11 and 13 and the second insulating layers 15, and the second conductive layer 314 may be arranged therebetween.

The second insulating layer 15 may include: a first area 15a (e.g., the portion that extends horizontally in FIG. 9) arranged on the top surface of the second conductive layer 314; a second area 15b (e.g., the portion that extends vertically in FIG. 9) arranged to cover the end of the second conductive layer 314 by changing the direction from the first area 15a; and the third area 15c (e.g., the portion that extends horizontally alongside the lower electrode 10 in FIG. 9) arranged between the end of the second area 316b of the first conductive layer 316 and the lower substrate 10 by changing the direction from the second area 15b.

The third insulating layer 17 may be arranged on the first conductive layer 316, and may include the first area 17a (e.g., the portion that extends horizontally in FIG. 9) arranged on the top surface of the first conductive layer 316, and the second area 17b (e.g., the portion that extends vertically in FIG. 9) extended along the side portion of the first conductive layer 316 in the inward direction of the openings C1 by changing the direction from the first area 17a.

The partition 320 that is formed on the same layer (or at the same level) and of the same material (or of the same layered structure) as the first insulating layers 11 and 13, the second insulating layer 15, and the third insulating layer 17 may be arranged inside the openings C1 included in the insulating layer IL.

On the lower substrate 10 in the center Ct of the sealing member 400, the insulating layer IL including the openings C1, the first insulating layers 11 and 13, and the second insulating layer 15, and the third insulating layer 17 arranged on the second insulating layer 15 may be arranged.

The second conductive layer 314 may be arranged between the first insulating layers 11 and 13 and the second insulating layer 15, and the partition 320 that is formed on the same layer and of the same material as the first insulating layers 11 and 13, the second insulating layer 15, and the third insulating layer 17 may be arranged inside the openings C1 included in the insulating layer IL.

That is, the first conductive layer 316 covering the top surface and the side portion of the insulating layer IL may not be arranged at the center Ct of the sealing member 400. The second conductive layer 314 may absorb the laser beam, and conduct the heat generated due to the absorption of the laser beam. However, the second conductive layer 314 is not extended into the insides of the openings C1 so that the first and second conductive layers 316 and 314 may have different absorption of the laser beam and heat conduction.

Therefore, uneven intensity of the laser beam irradiated to the sealing member 400 may be eliminated due to the above configuration, and thus the entire area of the sealing member 300 may be evenly hardened.

As described above, according to the one or more of the above embodiments of the present invention, the organic light-emitting display apparatus hardens the sealing member evenly and efficiently, and thus adhesion of the lower and upper substrates may be improved.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting display apparatus comprising:
   a lower substrate comprising a major surface which comprises a display area for displaying an image thereon and a sealing area surrounding the display area when viewed in a direction perpendicular to the major surface;
   an insulating structure disposed over the lower substrate in both the display area and the sealing area;
   a plurality of openings formed through the insulating structure in the sealing area, the plurality of openings comprising inner side surfaces;
   a first conductive layer disposed in the sealing area, comprising:
      a first portion over the insulating structure extending in a horizontal direction that is generally parallel to the major surface, and
      a second portion extending on at least part of the inner side surfaces of the plurality of openings in a vertical direction that is generally perpendicular to the major surface;
   a second conductive layer disposed directly under the first conductive layer in the sealing area;
   an upper substrate placed over the lower substrate; and
   a sealing member interposed between the lower substrate and the upper substrate in the sealing area thereof and filling the plurality of openings, wherein the sealing member is in contact with the lower substrate through the plurality of openings, thereby integrating the lower and upper substrates, and
   wherein the first and second conductive layers are insulated from the lower substrate and the sealing member, and the first conductive layer is insulated from the second conductive layer.

2. The organic light-emitting display apparatus of claim 1, wherein the insulating structure comprises a plurality of insulating layers.

3. The organic light-emitting display apparatus of claim 2, wherein the plurality of insulating layers comprise a first insulating layer and a second insulating layer over the first insulating layer, wherein the second conductive layer interposed between the first and second insulating layers of the insulating structure.

4. The organic light-emitting display apparatus of claim 3, wherein the second insulating layer comprises:
   a first portion formed over the second conductive layer and extending generally in the horizontal direction; and
   a second portion formed on a side surface of the second conductive layer and extending generally in the vertical direction, thereby providing at least part of the inner side surfaces of one of the plurality of openings.

5. The organic light-emitting display apparatus of claim 4, wherein the second insulating layer further comprises a third portion extending from second portion generally in the horizontal direction.

6. The organic light-emitting display apparatus of claim 1, further comprising a third insulating layer disposed on the first conductive layer.

7. The organic light-emitting display apparatus of claim 6, wherein the third insulating layer further comprises:
   a first portion extending generally in the horizontal direction on the first portion of the first conductive layer; and
   a second portion formed on the second portion of the first conductive layer and extending generally in the vertical direction.

8. The organic light-emitting display apparatus of claim 1, further comprising a partition disposed inside the sealing area.

9. The organic light-emitting display apparatus of claim 8, wherein the partition comprises generally a same layered structure as the insulating structure.

10. The organic light-emitting display apparatus of claim 3, further comprising:
    a first thin film transistor (TFT) comprising a first activation layer and a first gate electrode disposed in the display area; and a second TFT comprising a second activation layer and a second gate electrode disposed in the display area,
    wherein the first and second gate electrodes are at different levels.

11. The organic light-emitting display apparatus of claim 10, wherein the first conductive layer is arranged at the same level as the second gate electrode, and the second conductive layer is arranged at the same level as the first gate electrode.

12. The organic light-emitting display apparatus of claim 11, further comprising:
    a first gate insulating layer interposed between the first activation layer and the first gate electrode; and
    a second gate insulating layer disposed on the first gate electrode,
    wherein the second activation layer is disposed at the same level as the first activation layer, and
    the second gate electrode is disposed on the second gate insulating layer over the second activation layer.

13. The organic light-emitting display apparatus of claim 12, wherein the first insulating layer in the sealing area comprises a portion that extends from the first gate insulating layer in the display area, and the second insulating layer in the sealing area comprises a portion that extends from the second gate insulating layer in the display area.

14. The organic light-emitting display apparatus of claim 3, further comprising:
    a driving thin film transistor comprising a driving activation layer and a driving gate electrode;
    a capacitor comprising the driving gate electrode functioning as a lower electrode, and an upper electrode;
    a first gate insulating layer interposed between the driving activation layer and the driving gate electrode; and
    a second gate insulating layer interposed between the driving gate electrode and the upper electrode.

15. The organic light-emitting display apparatus of claim 14, wherein the first conductive layer is disposed at the same level as the upper electrode, and the second conductive layer is disposed at the same level as the driving gate electrode.

16. The organic light-emitting display apparatus of claim 14, wherein the first insulating layer in the sealing area comprises a portion that extends from the first gate insulating layer in the display area, and the second insulating layer in the sealing area comprises a portion that extends from the second gate insulating layer in the display area.

17. The organic light-emitting display apparatus of claim 1, wherein the first conductive layer is disposed only at an edge of the sealing area.

18. The organic light-emitting display apparatus of claim 1, wherein the insulating structure, the first conductive layer, and the second conductive layer are disposed at an edge of the sealing area.

19. The organic light-emitting display apparatus of claim 1, further comprising at least one organic light-emitting device disposed in the display area,
    wherein the at least one organic light-emitting device comprises:
    a pixel electrode;
    an opposite electrode placed over the pixel electrode; and
    an intermediate layer arranged between the pixel electrode and the opposite electrode, and comprising an organic emission layer.

20. The organic light-emitting display apparatus of claim 1, wherein the sealing member comprises frit.

* * * * *